United States Patent [19]
Ghoshal

[11] Patent Number: 5,493,243
[45] Date of Patent: Feb. 20, 1996

[54] DIGITALLY CONTROLLED FIRST ORDER JITTER ATTENTUATOR USING A DIGITAL FREQUENCY SYNTHESIZER

[75] Inventor: Sajol C. Ghoshal, Orangevale, Calif.

[73] Assignee: Level One Communications, Inc., Sacramento, Calif.

[21] Appl. No.: 177,172

[22] Filed: Jan. 4, 1994

[51] Int. Cl.$^6$ .............................. H03L 7/00; H03D 13/00
[52] U.S. Cl. .......................... 327/158; 327/150; 327/308; 331/179
[58] Field of Search ................................ 331/1 A, 25, 34, 331/57, 179; 327/236, 256, 147, 141, 150, 151, 156, 160, 159, 308, 244, 158

[56] References Cited

U.S. PATENT DOCUMENTS

| | | | |
|---|---|---|---|
| 3,516,007 | 6/1970 | Bos et al. | |
| 3,579,122 | 5/1971 | Paine et al. | 328/162 |
| 3,731,219 | 5/1973 | Mader et al. | 331/14 |
| 3,931,585 | 1/1976 | Barker et al. | 331/1 A |
| 4,091,335 | 5/1978 | Giolma et al. | 331/1 A |
| 4,129,748 | 12/1978 | Saylor | 118/69.1 |
| 4,242,639 | 12/1980 | Boone | 328/155 |
| 4,270,183 | 5/1981 | Robinson et al. | 364/900 |
| 4,360,788 | 11/1982 | Erps et al. | 331/1 A |
| 4,490,688 | 12/1984 | Borras et al. | 331/1 A |
| 4,539,531 | 9/1985 | Thomas et al. | 331/11 |
| 4,563,657 | 1/1986 | Qureshi et al. | 331/14 |
| 4,565,976 | 1/1986 | Campbell | 331/57 |
| 4,584,695 | 4/1986 | Wong et al. | 375/8 |
| 4,633,488 | 12/1986 | Shaw | 375/120 |
| 4,667,168 | 5/1987 | Shiomi et al. | 331/1 R |
| 4,712,223 | 12/1987 | Nelson | 322/43 |
| 4,733,197 | 3/1988 | Chow | 331/1 A |
| 4,791,386 | 12/1988 | Shiga | 331/1 A |
| 4,805,198 | 2/1989 | Stern et al. | 375/118 |
| 4,855,683 | 8/1989 | Troudet et al. | 328/155 |
| 4,862,485 | 8/1989 | Guinea et al. | 375/120 |
| 4,906,941 | 3/1990 | Kato et al. | 328/155 |
| 4,941,156 | 7/1990 | Stern et al. | 375/118 |
| 4,972,442 | 11/1990 | Steierman | 375/108 |
| 4,975,660 | 12/1990 | Svenson | 331/1 A |
| 5,008,637 | 4/1991 | Ray | 331/8 |

(List continued on next page.)

FOREIGN PATENT DOCUMENTS

| | | |
|---|---|---|
| 0140042 | 5/1985 | European Pat. Off. . |
| 0576168 | 12/1993 | European Pat. Off. . |

OTHER PUBLICATIONS

Cheng–Chung Shih and Sam Yinshang Sun, "Jitter Attenuation Phase Locked Loop Using Switched Capacitor Controlled Crystal Oscillator," Rockwell International, Semiconductor Products Division, Newport Beach, California, n.d., 3 pp.

Floyd M. Gardner, Ph.D., *Phaselock Techniques*, 2nd ed., John Wiley & Sons, n.d., pp. 92–143.

Dr. Roland E. Best, "Theory of the Digital PLL," *PHASE–LOCKED LOOPS: Theory, Design, and Applications*, McGraw–Hill Book Company, 1984, pp. 69–110.

IBM Technical Disclosure Bulletin, vol. 27, No. 3, Aug. 1, 1984, New York, USA, pp. 1463–1464, M. Cukier, "Fast Digital Phase–Locked Oscillator".

Motorola Technical Developments, vol. 13, Jul. 1, 1991; Schaumberg, US pp. 11–13, S. MCCaslin, "Ring Oscillator PLL Phase Selectors".

*Primary Examiner*—Timothy P. Callahan
*Assistant Examiner*—Dinh T. Le
*Attorney, Agent, or Firm*—Merchant, Gould, Smith, Edell, Welter & Schmidt

[57] ABSTRACT

A circuit for attenuating phase jitter on an incoming clock signal includes a digital frequency synthesizer, and a phase lock loop including a phase detector. The digital phase detector compares the phase relationship between an incoming signal and a clock signal generated by the digitally controlled frequency synthesizer and produces an output signal proportional to the phase difference. The output signal comprises both a direction indicator and a magnitude indicator for controlling the digitally controlled frequency synthesizer. One of a plurality of phases of a voltage controlled oscillator (VCO) are selected in response to the output signal to alter the frequency of the clock signal.

11 Claims, 5 Drawing Sheets

U.S. PATENT DOCUMENTS

| | | | |
|---|---|---|---|
| 5,057,794 | 10/1991 | Shih | 331/1 A |
| 5,059,924 | 10/1991 | JenningsCheck | 331/1 A |
| 5,068,628 | 11/1991 | Ghoshal | 331/1 A |
| 5,077,529 | 12/1991 | Ghoshal et al. | 328/155 |
| 5,079,519 | 1/1992 | Ashby et al. | 327/43 |
| 5,159,291 | 10/1992 | Ghoshal | 331/1 A |
| 5,162,746 | 11/1992 | Ghoshal | 328/155 |
| 5,181,228 | 1/1993 | Takatori | 325/103 |
| 5,317,283 | 5/1994 | Korhonen | 331/1 A |

DIGITALLY CONTROLLED FIRST ORDER JITTER ATTENTUATOR USING A DIGITAL FREQUENCY SYNTHESIZER

BACKGROUND OF THE INVENTION

1. Field of the Invention

This invention relates in general to jitter attenuators, and in particular, to a jitter attenuator circuit comprising a first order loop having a digital phase detector and a digital frequency synthesizer.

2. Description of Related Art

Jitter attenuation circuits are well known in the art for absorbing phase variations from signals. If these phase variations are not eliminated, they can cause significant errors in digital signals.

Improvements in jitter attenuators have been devised. One example of a prior jitter attenuator is shown in U.S. Pat. No. 5,162,746, issued Nov. 10, 1992, to Sajol Ghoshal (the same inventor as the present application), assigned to the Assignee of the present invention, and entitled "DIGITALLY CONTROLLED CRYSTAL-BASED JITTER ATTENUATOR," which patent is incorporated by reference herein. The '746 patent discloses a circuit for attenuating phase jitter on an incoming clock signal, which circuit includes a digitally controlled oscillator and a phase lock loop including a phase detector. The oscillator is capable of generating a plurality of discrete frequencies selectable through digitally controlled inputs controlling switched, capacitively-loaded amplifier stages. The phase detector consists primarily of an up/down counter with an overflow/underflow limiter circuit.

The oscillator in the '746 patent exhibits inadequate rejection behavior and jitter enhancement when the frequency of the incoming jittered clock is substantially the same as one of the frequencies selectable by the amplifier load capacitance, and thus requires a dithering circuit. In addition, the number of selectable frequencies is proportional to the number of component amplifiers in the oscillator circuit, and thus may result in designs requiring a large number of components. Further, the range of frequencies available from the oscillator are limited by the selection of capacitor, amplifier and crystal components. Finally, the oscillator has non-linearities in its jitter performance due to load variations as capacitors are added and removed, and the resulting jolt on the oscillator.

A different oscillator design can be found in U.S. Pat. No. 5,059,924, issued Oct. 22, 1991, to William S. Jennings Check, assigned to the Assignee of the present invention, and entitled "CLOCK ADAPTOR USING A PHASE LOCKED LOOP CONFIGURED AS A FREQUENCY MULTIPLIER WITH A NON-INTEGER FEEDBACK DIVIDER," which patent is incorporated by reference herein. The '924 patent discloses a phase locked loop configured as a frequency multiplier capable of non-integral feedback path division, which utilizes a multi-phase voltage controlled oscillator which generates a plurality of signals having a substantially identical frequency but each offset equally from the other by a given phase angle. A commutator selects signals of adjacent phases so as to give the time average output signal a higher or lower frequency. Frequency translation is accomplished by periodically selecting signals having a longer or shorter period as desired so that a commutator output signal is delayed or advanced by an appropriate amount.

The oscillator in the '924 patent eliminates the non-linearities of oscillator circuit in the '726 patent. Further, the oscillator makes predictable adjustments to its clock period based on specific requests. Moreover, the oscillator can make finer adjustments in its clock period to maintain low intrinsic jitter. Finally, it is capable of generating N discrete frequencies.

Thus, there is a need in the art for a Jitter attenuator circuit combining and improving on the best elements of the '924 and '746 patents.

SUMMARY OF THE INVENTION

To overcome the limitations in the prior art described above, and to overcome other limitations that will be apparent upon reading and understanding the present specification, the present invention discloses a jitter attenuation circuit comprised of a digital phase detector and a multi-frequency digitally controlled frequency synthesizer. The digital phase detector compares the phase relationship between an incoming signal and a clock signal generated by the digitally controlled frequency synthesizer and produces an output signal proportional to the phase difference. The output signal indicates both a direction and a magnitude of frequency change for the digitally controlled frequency synthesizer. One of a plurality of phases of a voltage controlled oscillator (VCO) is selected in response to the output signal to alter the frequency of the clock signal.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

JITTER ATTENUATOR

Figure 1:
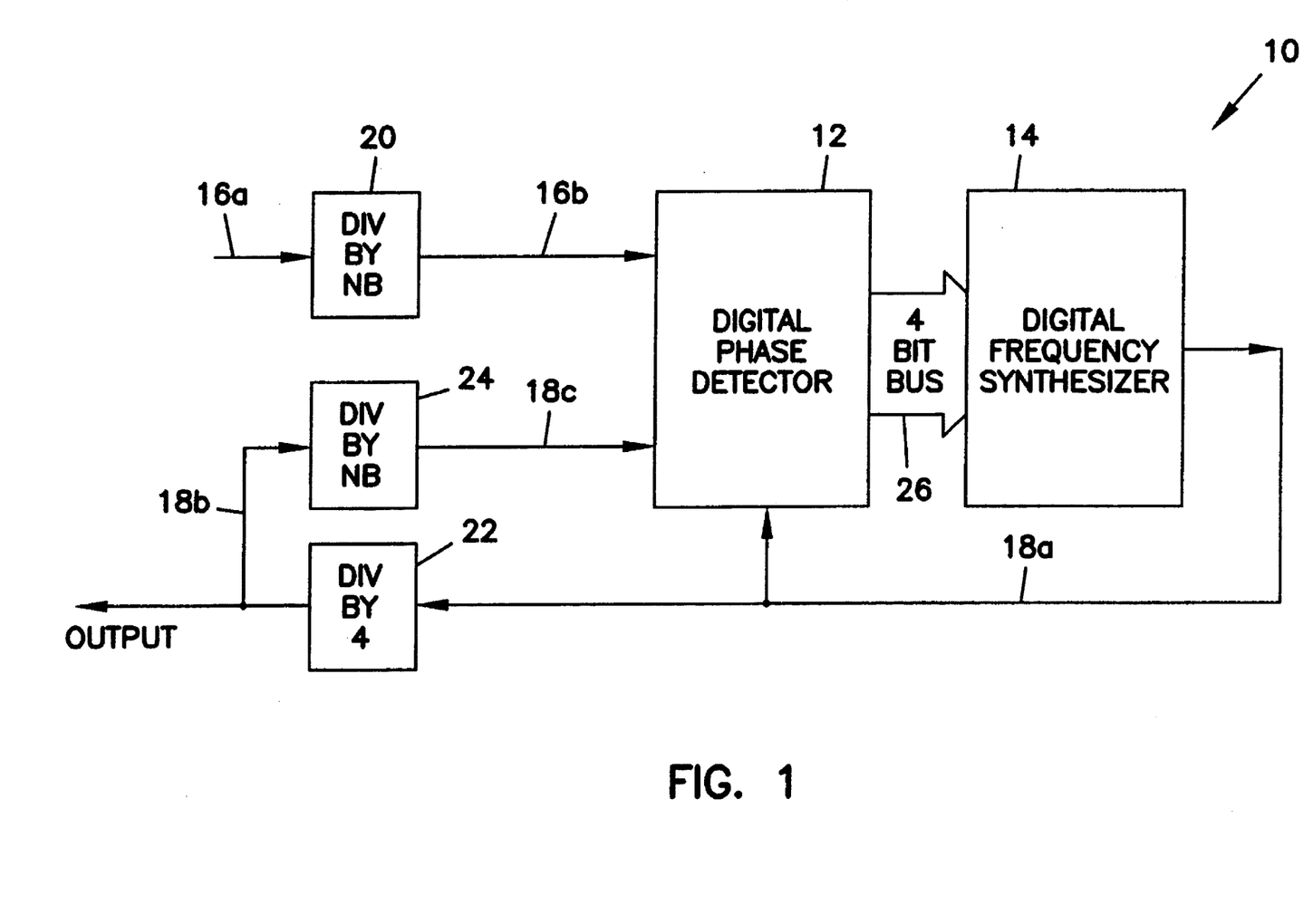
FIG. 1 is a block diagram describing the jitter attenuator circuit of the present invention.

FIG. 1 is a block diagram describing the jitter attenuator circuit 10 of the present invention. The jitter attenuator 10 operates as a first order loop and is comprised of a digital phase detector 12 driving a multi-frequency digitally controlled frequency synthesizer 14.

The inputs to the digital phase detector 12 comprise two signals, i.e., an incoming signal 16a and a 4× clock signal 18a. The incoming signal 16a is divided by NB at divider 20 to create a divided down incoming signal 16b. The 4× clock signal 18a is divided by 4 at divider 22 to create a 1× clock signal 18b, and then the 1× clock signal 18b is divided by NB at divider 24 to create a clock signal 18c that matches the frequency of the incoming signal 16b. Those skilled in the art will recognize that other clock multiplier values and divisor values could be substituted for the examples shown in FIG. 1.

The digital phase detector 12 compares the phase relationship of the incoming signal 16b and the clock signal 18c to produce an output signal 26 proportional to the phase difference therebetween. Ideally, the output signal 26 should be monotonic with limiters at the top and bottom of its range, thereby eliminating roll-over problems.

The digital frequency synthesizer 14 generates the 4× clock signal 18a at one of $N_f$ selectable frequencies. Moreover, the jitter attenuator 10 has a selectable bandwidth BW:

$$BW = \frac{Dw}{(2 * \pi * NB)}$$

wherein Dw is the pull range per step of the phase locked loop and NB is a selectable divisor value loaded into dividers 20 and 24 for the incoming signal 16a and the 1× clock signal 18b, respectively.

DIGITAL PHASE DETECTOR

Figure 2:
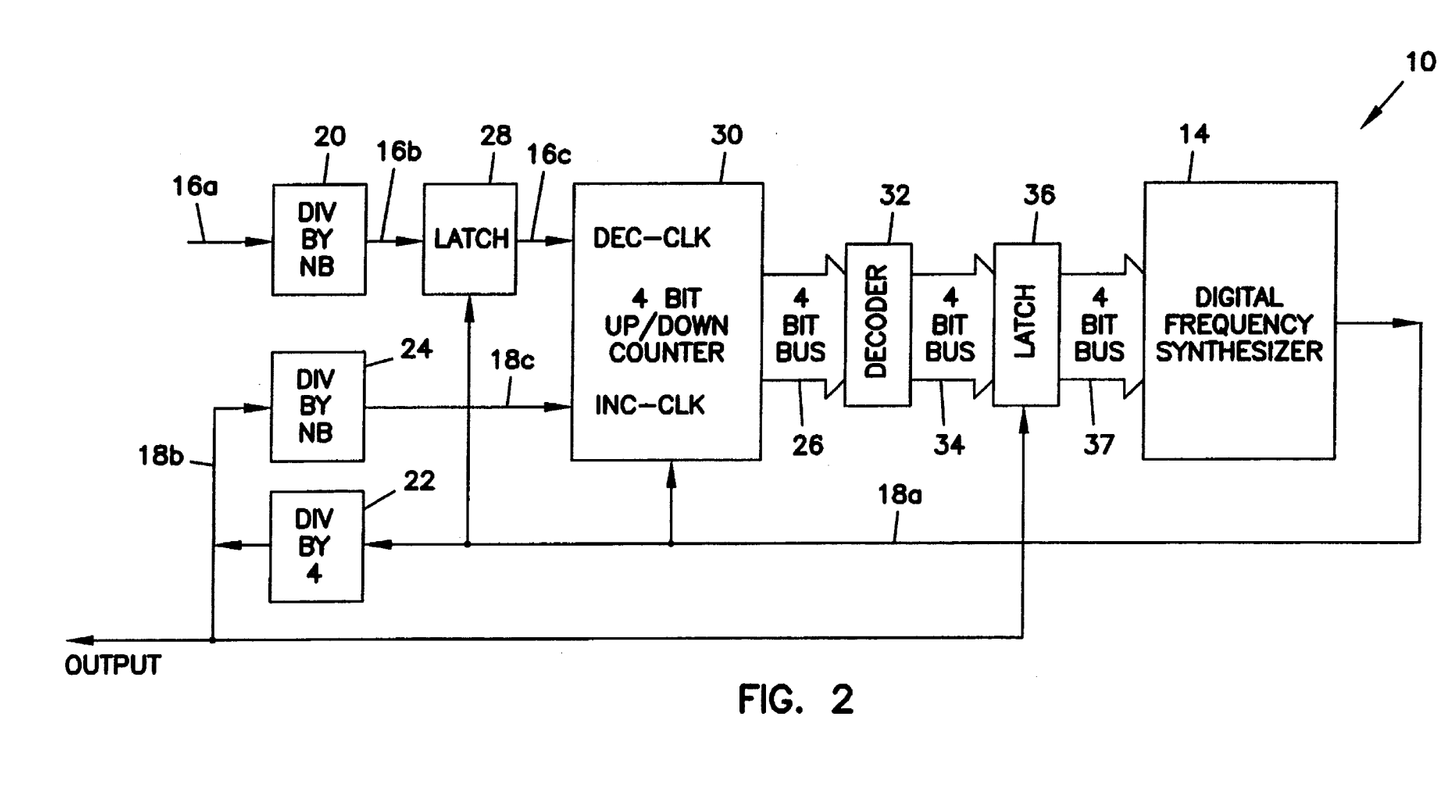
FIG. 2 is a block diagram depicting the digital phase detector of the jitter attenuator circuit.

FIG. 2 is a block diagram depicting the components of the digital phase detector 12. The digital phase detector 12 comprises a latch 28, a 4-bit up/down counter 30, a decoder 32, a bus 34, a latch 36, and a 4-bit control signal 37.

The incoming signal 16a and the 1× clock signal 18b are divided down by dividers 20 and 24 respectively to achieve the required bandwidth. A divide by 2 (NB=2) at dividers 20 and 24 produces a 6 Hz bandwidth, and a divide by 4 (NB=4) at dividers 20 and 24 produces a 3 Hz bandwidth. Those skilled in the art will recognize that other NB values could be loaded into dividers 20 and 24 to provide different bandwidths.

The output of divider 20 is synchronized to the 4× clock signal 18a through the latch 28 that outputs incoming signal 16c. The output of divider 24 is, of course, the divided down clock signal 18c, and by definition is synchronized to the 4× clock signal 18a. The counter 30 is also synchronized to the 4× clock signal 18a. Thus, the incoming signal 16c and the clock signal 18c are input to the counter 30 on a boundary of the 4× clock signal 18a, or at 0.25 unit intervals (UI) of the incoming signal 16a. Moreover, the incoming signal 16c and the clock signal 18c are split by an integer number of cycles of the 4× clock signal 18a, which is the effective adjustment boundary.

The counter 30 acts as a phase/frequency detector with no aliasing or roll-over problems. The counter 30 is incremented by the rising edge of the clock signal 18c and decremented by the rising edge of the incoming signal 16c. If the phase difference between the incoming signal 16c and the clock signal 18c exceeds one cycle of the clock signal 18c, then the control signal 37 is output from the latch 36 is changed (i.e., incremented or decremented) to correct for the phase difference.

In the preferred embodiment, the counter 30 ranges in value from 0 to 15. The center frequency of the synthesizer 14 corresponds to a counter 30 value of 7 or 8, i.e., the mid-point value of the counter 30. The frequency of the synthesizer 14 increases or decreases proportionally as the counter 30 value increases or decreases from the mid-point value.

In the absence of jitter on the incoming signal 16b, and in the presence of frequency offset between the incoming signal 16c and the clock signal 18c, the counter 30 holds a value which keeps the clock signal 18c at the frequency closest to the frequency of the incoming signal 16b, and causes the clock signal 18c to jump back and forth between the two frequencies greater than and less than the frequency of incoming signal 16b. In the absence of jitter on the incoming signal 16b, and when the counter 30 is not close to the average frequency position of the digital frequency synthesizer 14, the phase of the clock signal 18c is allowed to slip with respect to the incoming signal 16c in an effort to increment or decrement the counter 30, i.e., driving it towards the average frequency position closest to the average frequency of the incoming signal 16b. Once it reaches that position, it stays there, beating between two positions, to maintain the correct average frequency for the clock signal 18c.

The counter 30 produces a 4-bit output signal 26 proportional to the phase difference between the incoming signal 16c and the clock signal 18c. The output signal 26 is only modified if the phase difference between the incoming signal 16c and the clock signal 18c is greater than 0.25 UI or one cycle of the 4× clock signal 18a.

The function of the decoder 32 is to translate the output signal 26 into a 4-bit control signal 34 according to the logic of Table 1. The first column of Table 1 lists the counter 30 values, ranging from 0 to 15. The second column of Table 1 represents the corresponding most significant bit (MSB) of the output signal 26. The third column of Table 1 represents the corresponding 3 least significant bits (LSBs) of the output signal 26. The fourth column of Table 1 represents the corresponding Direction (DUP) bit of the control signal 34, which indicates the direction of the phase difference. The fifth column of Table 1 represents the corresponding Magnitude (D<2,1,0>) bits of the control signal 34, which indicate the magnitude of the phase difference.

The control signal 34 is sampled and stored by the latch 6, which outputs the control signal 37 to the digital frequency synthesizer 14. The control signal 37 output from the latch 36 controls the frequency of the synthesizer 14. The clock for the latch 36 is the 1× clock signal 18b output from divider 22, which means that the latch 36 is updated only once for every cycle of the 1× clock signal 18b.

Figure 3:
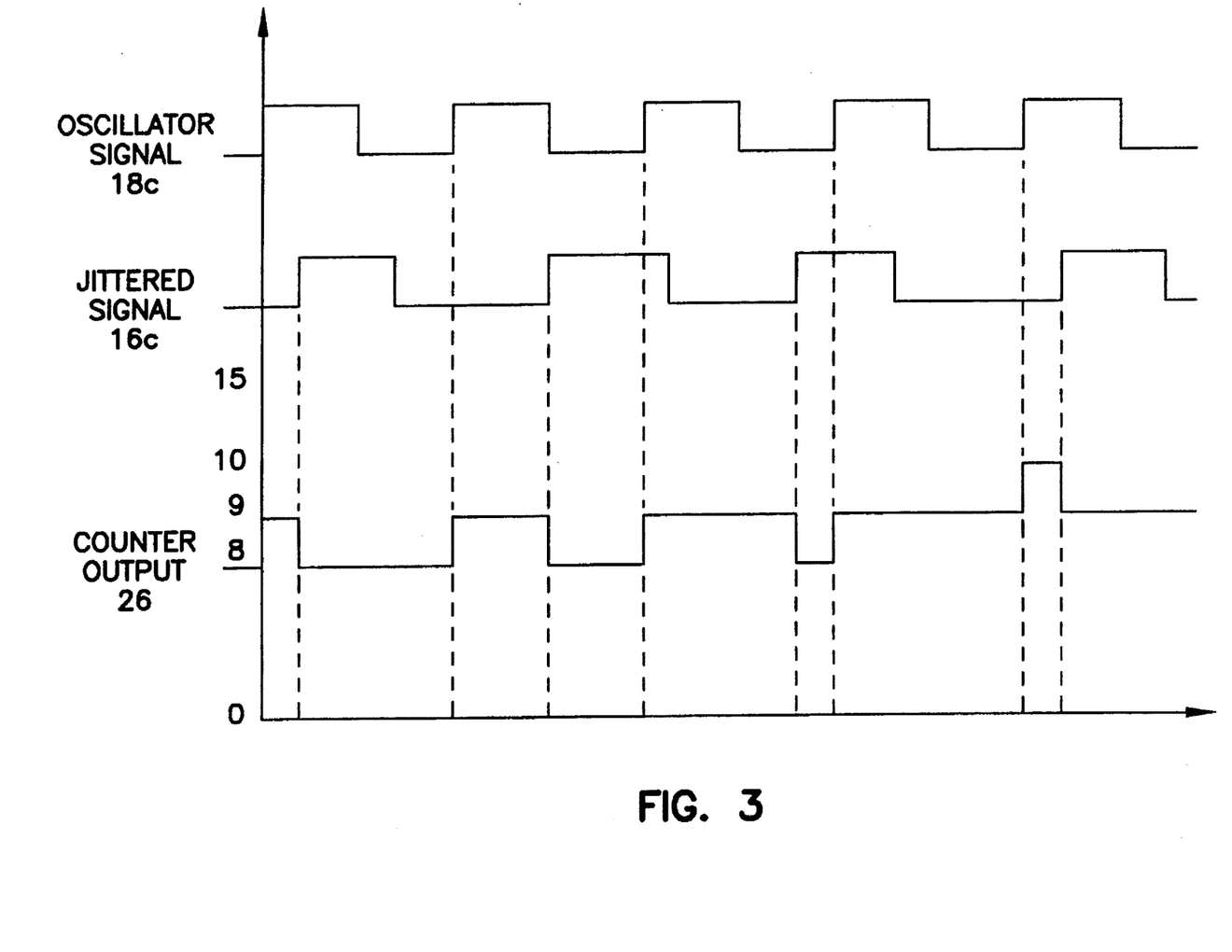
FIG. 3 is a graphical representation of the operation of the digital phase detector of the jitter attenuation circuit.

FIG. 3 is a graphical representation of the operation of the digital phase detector 12. The output signal 26 pulses between the values 8 and 9, staying at 9 longer as the phase difference between the incoming signal 16c and clock signal 18c becomes greater. When the phase difference between the incoming signal 16c and the clock signal 18c exceeds one cycle of the clock signal 18c, then the counter 30 increments to 9 and pulses between the values 9 and 10. When the counter 30 reaches the limits of its range, i.e., 0 or 15, it is clamped so that it does not roll-over after one cycle or $2\pi$ radians of phase difference. Since the counter 30 is centered at a value of 7 or 8, it provides ±14 (7*2)$2\pi$ radians of range before being clamped.

The period of the output signal 26 of the phase detector 12 is determined by the clock multiplier value as well as the cumulative divisor value of the loop. For a 6 Hz bandwidth (NB=2), the period of the output signal 26 is 8 (4*2) cycles of the 4× clock signal 18a. Further, within those 8 cycles, the phase detector 12 can pulse its value on any boundary of the 4× clock signal 18a. Those skilled in the art will recognize that the bandwidth, period, and phase resolution are determined by the clock multiplier value and the divisor value, and thus are selectable according to the desired application.

CLAMPING 4-BIT UP/DOWN COUNTER

Figure 4:
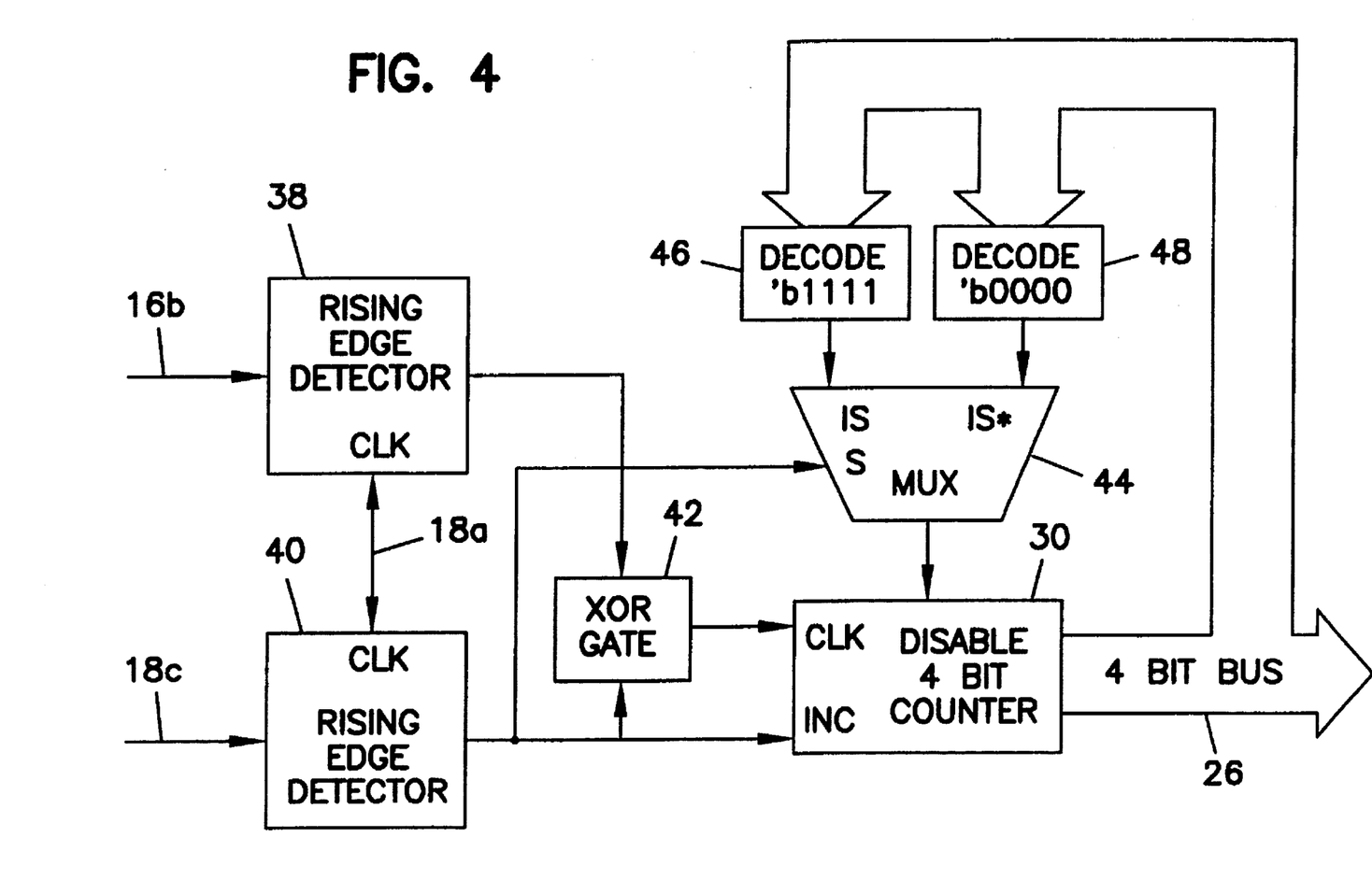
FIG. 4 is a block diagram of the clamping 4-bit up/down counter of the digital phase detector.

FIG. 4 is a block diagram illustrating the control logic for the clamping 4-bit up/down counter 30 of the digital phase detector 12. The counter 30 has clock, increment and disable inputs. First and second rising edge detectors 38 and 40 produce pulses for one cycle of the 4× clock signal 18a, if rising edges are detected on the incoming signal 16c or the clock signal 18c. The outputs of both rising edge detectors 38 and 40 are input to an exclusive-or (XOR) gate 42 to produce the clock input for the counter 30. When the incoming signal 16c and clock signal 18c are in phase, the XOR gate 42 produces no clock input. The output of the rising edge detector 40 is also supplied to the increment input of the counter 30. The counter 30 increments on every clock pulse where the increment input is high. The counter 30 decrements on every clock pulse where the increment input is low.

The clamping function for the counter 30 is provided by a multiplexor 44 and first and second decoders 46 and 48. The counter 30 is clamped by supplying an all zeros or all ones pattern from the counter 30 to the multiplexor 44. The multiplexor 44 is selected by the output of the rising edge detector 40. If an increment occurs and the output of the counter 30 is an all ones pattern, then the counter 30 is disabled from counting. Similarly, if a decrement occurs and the output of the counter 30 is an all zeros pattern, then the counter 30 is once again disabled from counting.

DIGITAL FREQUENCY SYNTHESIZER

Figure 5:
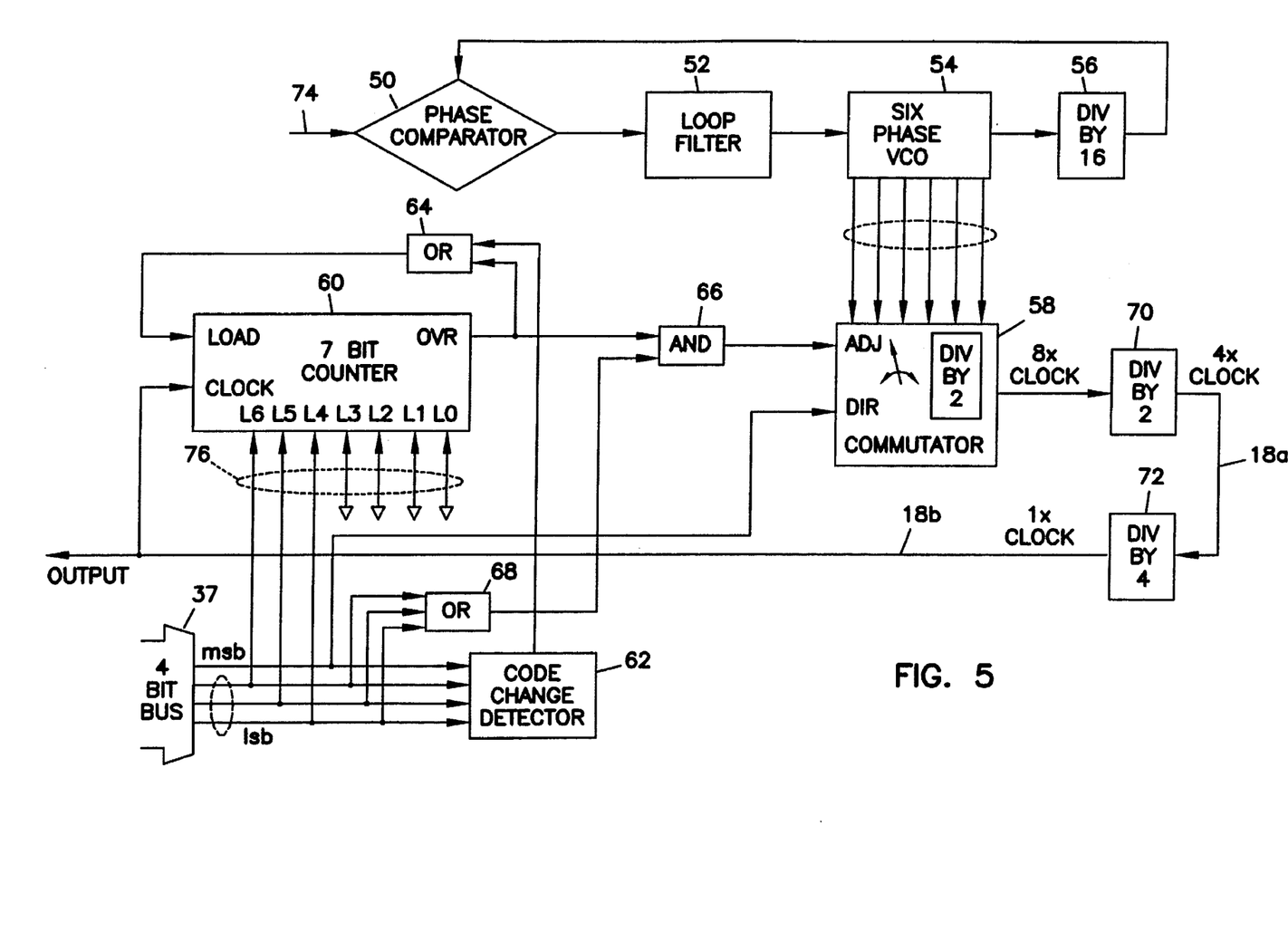
FIG. 5 is a block diagram of the digital frequency synthesizer of the jitter attenuation circuit.

FIG. 5 is a block diagram illustrating the components of the digital frequency synthesizer 14. The digital frequency synthesizer 14 is comprised of a phase comparator 50, loop filter 52, six phase voltage controlled oscillator (VCO) 54, divider 56, and commutator 58. The additional blocks in FIG. 5 comprise the logic required to control the $N_f$ discrete frequencies produced by the digital frequency synthesizer 14, including a 7-bit loadable counter 60, a code change detector 62, OR gate 64, AND gate 66, OR gate 68, and first and second dividers 70 and 72.

The synthesizer 14 is fundamentally a second order phase locked loop (PLL). The PLL is phase locked to a "clean" master reference clock signal 74 whose frequency is close to the frequency of the incoming signal 16b. The phase comparator 50 compares the reference clock signal 74 to the divided down output of the VCO 54 to produce an output signal. The output signal from the phase comparator 50 is comprised of pulses, wherein the pulse widths are proportional to the phase difference between the reference clock signal 74 and the divided down output of the VCO 54. These pulses are filtered through a loop filter 52 to produce a control signal having a magnitude proportional to the phase difference. This control signal controls the frequency of the VCO 54 to maintain a frequency lock with the reference clock signal 74.

In the preferred embodiment, the VCO 54 nominally operates at 16 times the frequency of the reference clock signal 74, and thus the divider 56 divides the output of the VCO 54 by 16 to produce a 1× clock signal for the phase comparator 50. Those skilled in the art will recognize that other clock multiplier values could also be used.

The VCO 54 produces 6 phases of a 16× clock signal for input to the commutator 58. These phases of the 16× clock signal are spaced at 60 degree (360/6=60) phase intervals. Those skilled in the art will recognize that alternative numbers of phase outputs and spacings therebetween could also be used without departing from the scope of the present invention.

The commutator 58 selects one of the 6 phases of the VCO 54 output based on the demand specified at its ADJ and DIR inputs. When the ADJ input is high, the commutator 58 selects a phase. If the DIR input is low, the commutator 58 selects a phase later in time, thereby executing a slow down operation. If the DIR input is high, the commutator 58 selects a phase earlier in time, thereby executing a speed up operation.

The phase resolution of the commutator 58 is 1/6th of the 16× clock signal or 1/96th [1/(6*16)] of the 1× clock signal 18b. This provides a low deterministic intrinsic jitter of 1/96 or 0.0104 UI.

The output of the commutator 58 has a built-in divide by 2 function and hence produces an 8× clock signal. This 8× clock signal is input to a divide by 2 divider 70 to produce the 4× clock signal 18a. The 4× clock signal 18a is further input to a divide by 4 divider 72 to produce a 1× clock signal 18b for the counter 60.

If the commutator 58 is adjusted for every 1× clock signal 18b cycle, the synthesizer 14 produces a frequency of 10417 [$(10^6/96)$] parts per million (ppm) from the frequency of the reference clock signal 74. If the commutator 58 is adjusted every 256 bit times, then the synthesizer 14 produces a frequency of 41 [$10^6/(96*256)$] ppm from the frequency of the reference clock signal 74. Thus, an infinite number of frequencies can be generated from the synthesizer 14 by making adjustments to the commutator 58 at various repetitive bit times. For design applications which require 16 discrete frequencies (N=16), 8 frequencies somewhat equally spaced would be selected for the speed up and slow down values.

The basic control for the discrete frequencies is provided by the 7-bit loadable counter 60. The counter 60 is clocked by the 1× clock signal 18b output from the divider 72. When the counter 60 overflows, i.e., reaches a count of 127 or $2^7-1$, the OVR output sets the LOAD input to the counter 60 through OR gate 64. When the LOAD input goes high, the counter 60 is loaded with a starting value as defined by the 7 loadable inputs 76.

In this embodiment, the 4 least significant bits of the inputs 76 are always held at zero, and the 3 most significant bits of the inputs 76 get their values from the 3 least significant bits of the control signal 37. The most significant bit of the control signal 37 controls the DIR input of the commutator 58. Whenever the counter 60 overflows, the OVR output from the counter 60 pulses the ADJ input of the commutator 58 through the AND gate 66, with the direction of the command given by the polarity of the DIR input. The ADJ input is only pulsed if the output of the OR gate 68 is high, and the output of the OR gate 68 is high if the 3 least significant bits of the control signal 37 are non-zero.

The frequency of the ADJ input of the commutator 58 controls the frequency of the synthesizer 14. The frequency of the ADJ input of the commutator 58 is, in turn, controlled by the initial loaded value in the counter 60. Table 2 provides a mapping of the 3 least significant bits of the control signal 37 (D<2,1,0>) to the inputs 76 (L<6 . . . 0>) and the corresponding synthesizer 14 frequencies.

The code change detector 62 detects when the control signal 37 changes its value. When the control signal 37 changes its value, the output of the code change detector 62 goes high, which causes the counter 60 to reload a new initial value determined from the inputs 76. This feature can be disabled for better jitter rejection, which causes the counter 60 to reload only on rollovers.

If the D<2,1,0> bits of the control signal 37 equal zero, then the counter 60 overflows at 128 clock cycles, but is disabled from making adjustments by the zero detect OR gate 68. If the D<2,1,0> bits of the control signal 34 equal one, then the counter 60 is loaded with an initial value of 16 and the counter 60 overflows every 112 clock cycles, thereby producing a synthesizer 14 frequency of 93 ppm. Table 2 describes additional synthesizer 14 frequencies and how they are obtained.

CONCLUSION

This concludes the description of the preferred embodiment of the invention. In summary, a jitter attenuation circuit has been described which accepts an incoming clock signal that has phase jitter on its edges, and generates a digitally synthesized clock signal that tracks the frequency of the incoming clock signal and reduces its jitter considerably. The jitter attenuator circuit is comprised of a digital phase detector driving a multi-frequency digitally controlled frequency synthesizer. The digital phase detector compares the phase relationship between an incoming signal and a clock signal generated by the digitally controlled frequency synthesizer and produces an output signal proportional to the phase difference. The output signal comprises both a direction indicator and a magnitude indicator for controlling the digitally controlled frequency synthesizer. One of a plurality of phases of a voltage controlled oscillator (VCO) is selected in response to the output signal to alter the frequency of the clock signal.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by its detailed description, but rather by the claims appended hereto.

TABLE 1

Decoder Truth Table

| Counter | MSB | LSB's | DUP | D<2,1,0> |
|---|---|---|---|---|
| 0 | 0 | 000 | 1 | 111 (7) |
| 1 | 0 | 001 | 1 | 110 (6) |
| 2 | 0 | 010 | 1 | 101 (5) |
| 3 | 0 | 011 | 1 | 100 (4) |
| 4 | 0 | 100 | 1 | 011 (3) |
| 5 | 0 | 101 | 1 | 010 (2) |
| 6 | 0 | 110 | 1 | 001 (1) |
| 7 | 0 | 111 | 1 | 000 (0) |
| 8 | 1 | 000 | 0 | 000 (0) |
| 9 | 1 | 001 | 0 | 001 (1) |
| 10 | 1 | 010 | 0 | 010 (2) |
| 11 | 1 | 011 | 0 | 011 (3) |
| 12 | 1 | 100 | 0 | 100 (4) |
| 13 | 1 | 101 | 0 | 101 (5) |
| 14 | 1 | 110 | 0 | 110 (6) |
| 15 | 1 | 111 | 0 | 111 (7) |

TABLE 2

Digital Frequency Synthesizer counter Table

| D<2,1,0> | L<6,5,4> | L<6..0> | Counter overflow | Freq (ppm) |
|---|---|---|---|---|
| 000 (0) | 000 | 16*0 = 0 | 128 | 0 |
| 001 (1) | 001 | 16*1 = 16 | 112 | 93 |

TABLE 2-continued

Digital Frequency Synthesizer counter Table

| D<2,1,0> | L<6,5,4> | L<6..0> | Counter overflow | Freq (ppm) |
|---|---|---|---|---|
| 010 (2) | 010 | 16*2 = 32 | 96 | 109 |
| 011 (3) | 011 | 16*3 = 48 | 80 | 130 |
| 100 (4) | 101 | 16*4 = 64 | 64 | 163 |
| 101 (5) | 101 | 16*5 = 80 | 48 | 217 |
| 110 (6) | 110 | 16*6 = 96 | 32 | 325 |
| 111 (7) | 111 | 16*7 = 112 | 16 | 651 |

What is claimed is:

1. A circuit for attenuating phase jitter on an incoming signal, comprising:

(a) a phase detector for generating digital control signals representing a phase difference between the incoming signal and a clock signal, the digital control signals comprising a direction signal for indicating a polarity of the phase difference and a magnitude signal for indicating a magnitude of the phase difference; and (b) a frequency synthesizer, coupled to the phase detector, for generating the clock signal to an output at one of a plurality of selectable frequencies in response to the direction and magnitude signals, wherein frequency synthesizer comprises means for initializing a loadable counter with a starting value determined from the magnitude signal from the phase detector, means for incrementing the loadable counter using the clock signal, means for generating an adjustment signal when the loadable counter overflows, and means for controlling the frequency of the clock signal in response to the adjustment signal from the loadable counter and the direction signal from the phase detector.

2. The circuit as set forth in claim 1, wherein the phase detector comprises:

an up/down counter for determining the phase relationship between the incoming signal and the clock signal and for producing the output signal proportional thereto; and means, coupled to the up/down counter, for incrementing and decrementing the up/down counter when the incoming signal is out of phase with the clock signal.

3. The circuit as set forth in claim 2, wherein the phase detector further comprises limiter means, coupled to the up/down counter, for disabling the up/down counter to prevent rollover when a count therein reaches a range boundary.

4. The circuit as set forth in claim 1, wherein the frequency synthesizer further comprises means for generating the clock signal at said one of the plurality of selectable frequencies.

5. The circuit as set forth in claim 4, wherein the circuit has a selectable bandwidth BW:

$$BW = \frac{Dw}{(2 * \pi * B)}$$

wherein Dw is the pull range per step of the frequency synthesizer and B is a multiplier value for the clock signal as compared to the incoming signal.

6. A jitter attenuation circuit, comprising:

(a) a digital phase detector for determining a phase difference between an incoming signal and a clock signal and for generating output signals proportional to the phase difference, wherein the output signals indicate both a direction and a magnitude of frequency change required to eliminate the phase difference; and (b) a digitally controlled frequency synthesizer, coupled to the digital phase detector, for generating the clock signal to an output in response to the direction and magnitude signals from the phase detector, wherein the frequency synthesizer comprises means for initializing a loadable counter with a starting value determined from the magnitude signal from the phase detector, means for incrementing the loadable counter using the clock signal, means for generating an adjustment signal when the loadable counter overflows, and means for controlling the frequency of the clock signal in response to the adjustment signal from the loadable counter and the direction signal from the phase detector.

7. The jitter attenuation circuit as set forth in claim 6, wherein the phase detector comprises:

an up/down counter for determining the phase relationship between the incoming signal and the clock signal and for producing the output signal proportional thereto; and means, coupled to the up/down counter, for incrementing and decrementing the up/down counter when the incoming signal is out of phase with the clock signal.

8. The jitter attenuation circuit as set forth in claim 7, wherein the phase detector further comprises limiter means, coupled to the up/down counter, for disabling the up/down counter to prevent rollover when a count therein reaches a range boundary.

9. The jitter attenuation circuit as set forth in claim 6, wherein the frequency synthesizer further comprises means for generating the clock signal at said one of the plurality of selectable frequencies.

10. The jitter attenuation circuit as set forth in claim 9, wherein the jitter attenuator has a selectable bandwidth BW:

$$BW = \frac{Dw}{(2 * \pi * B)}$$

wherein Dw is the pull range per step of the frequency synthesizer and B is a multiplier value for the clock signal as compared to the incoming signal.

11. A method for attenuating phase jitter on an incoming signal, comprising the steps of:

(a) generating digital control signals representing a phase difference between the incoming signal and a clock signal, wherein the digital control signals are comprised of a direction signal for indicating a polarity of the phase difference and a magnitude signal for indicating a magnitude of the phase difference; and (b) generating the clock signal at one of a plurality of selectable frequencies in response to the digital control signals, the generating step further comprising the steps of generating the clock signal according to the direction and magnitude signals, wherein the generating step comprises the steps of loading a counter with a starting value determined by the magnitude signal, incrementing the counter using the clock signal, generating an adjustment signal when the counter overflows, and controlling the frequency of the output clock signal using the adjustment signal from the counter and the direction signal from the phase detector.

* * * * *

UNITED STATES PATENT AND TRADEMARK OFFICE
CERTIFICATE OF CORRECTION

PATENT NO. : 5,493,243

DATED : February 20, 1996

INVENTOR(S) : Sajol C. Ghoshal

It is certified that error appears in the above-indentified patent and that said Letters Patent is hereby corrected as shown below:

On the Title page, item [54];

In the Title, "ATTENTUATOR" should read --ATTENUATOR--;

In column 10, line 20, please insert --to an output-- after the word "signal".

Signed and Sealed this

Sixth Day of August, 1996

Attest:

BRUCE LEHMAN

*Attesting Officer*   *Commissioner of Patents and Trademarks*